United States Patent
Yang et al.

(10) Patent No.: US 7,626,208 B2
(45) Date of Patent: Dec. 1, 2009

(54) BENDABLE SOLID STATE PLANAR LIGHT SOURCE STRUCTURE

(75) Inventors: Chien-Cheng Yang, Taipei County (TW); Chao-Kai Hsu, Hsinchu County (TW); Jing-Yao Chang, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 168 days.

(21) Appl. No.: 11/309,200

(22) Filed: Jul. 13, 2006

(65) Prior Publication Data

US 2007/0217200 A1 Sep. 20, 2007

(30) Foreign Application Priority Data

Mar. 17, 2006 (TW) .............................. 95109119 A (51) Int. Cl.
*H01L 33/00* (2006.01)
(52) U.S. Cl. .................. 257/88; 257/99; 257/E33.057; 257/E33.062; 257/E33.066
(58) Field of Classification Search .................. 257/88, 257/99, E33.057, E33.062, E33.066
See application file for complete search history.

(56) References Cited

U.S. PATENT DOCUMENTS

| | | | |
|---|---|---|---|
| 6,274,924 B1 | 8/2001 | Carey et al. | 257/676 |
| 6,860,620 B2 | 3/2005 | Kuan et al. | 362/294 |
| 7,303,315 B2 * | 12/2007 | Ouderkirk et al. | 362/294 |
| 7,360,924 B2 * | 4/2008 | Henson et al. | 362/241 |
| 2005/0116235 A1 * | 6/2005 | Schultz et al. | 257/79 |
| 2006/0091524 A1 * | 5/2006 | Karashima et al. | 257/700 |
| 2007/0080438 A1 * | 4/2007 | Yamanaka et al. | 257/676 |
| 2008/0067526 A1 * | 3/2008 | Chew | 257/88 |

\* cited by examiner

*Primary Examiner*—Ngan Ngo
(74) *Attorney, Agent, or Firm*—Jianq Chyun IP Office (57) ABSTRACT

A bendable LED planar light source structure, a flexible substrate therefore, and a manufacturing method thereof are provided. The flexible substrate has metal layers on both sides, where the metal layer on one side has a circuit layout, and the metal layer on the other side has a pattern structure or a whole metal coating with reflecting and scattering characteristics. Meanwhile, bonding pads are provided on the same side or opposite side as the metal layer with the circuit layout, and an array of LED dies is bonded with the bonding pads through wire bonding or flip chip bonding, such that the LED dies are conducted with current through the circuit layout on the flexible substrate, so as to form a planar light source.

12 Claims, 10 Drawing Sheets

BENDABLE SOLID STATE PLANAR LIGHT SOURCE STRUCTURE

CROSS-REFERENCE TO RELATED APPLICATION

This application claims the priority benefit of Taiwan application serial no. 95109119, filed on Mar. 17, 2006. All disclosure of the Taiwan application is incorporated herein by reference.

BACKGROUND OF THE INVENTION

1. Field of Invention

The present invention relates to an solid state planar light source structure, and more particularly, to a bendable LED planar light source structure, a flexible structure and a manufacturing method thereof, which is directly bonded with a bendable metal sub-mount having a circuit, so as to enhance the thermal conduction effect, thereby achieving preferable photoelectric characteristics and higher light-emitting efficiency.

2. Description of Related Art

Solid state lighting (SSL) is a micro solid state light source having the advantages of desired shock resistance, power saving, long life-span, and diversified and pure colors, which meets various application demands and has gradually become a popular light source. SSLs are mainly classified into visible light SSLs and non-visible light SSLs, and the visible light SSL is mainly applied in back light, interior lighting, landscape lighting, mobile lighting, and the like. Currently, there are many difficulties when applying the feature of bendability to SSL, for example, first, SSL dies are made of rigid and friable materials and cannot be bent. Next, when the SSL is applied in the back light module, the SSL lamp is jointed with a substrate having a large area, such that heat dissipation is poor, and failure of the SSL element is accelerated. Further, the SSL substrate itself has the effect of light-absorbing, such that the forward light-emitting efficiency of the SSL is reduced.

Since the SSL chip is a non-directional light source, the forward emitted light of the SSL Chip is rather limited, and with the additional absorption effect of the substrate, the internal absorption loss of the SSL becomes excessively large, thus, the external light extraction efficiency is relatively low. Currently, some manufacturers are researching how to improve the light emitting efficiency and to prevent the substrate from absorbing light. Generally, a substrate transposing technique is used, or a layer of reflect surface is coated on the substrate, or large-scaled SSL dies, i.e., greater than or equal to 40 mils, are used to generate high power, and thereby increasing the forward emitted light. However, using the large-scaled ($\geq$40 mil) SSL dies results in problems of poor current distribution and poor light-emitting efficiency due to the heat accumulation. In order to improve the heat dissipation efficiency of the SSL, the SSL chip generally uses a heat sink substrate or has a heat sink compound coated thereon to be packed into an SSL lamp. However, the heat dissipation effect is also limited. In addition, in order to adjust the light axial area, the current large-size SSL planar light sources (back light plates) are all formed by using SSL lamps together with light guides, or by using an array of SSL lamps, thus, the SSL planar light source is not bendable.

Figure 1:
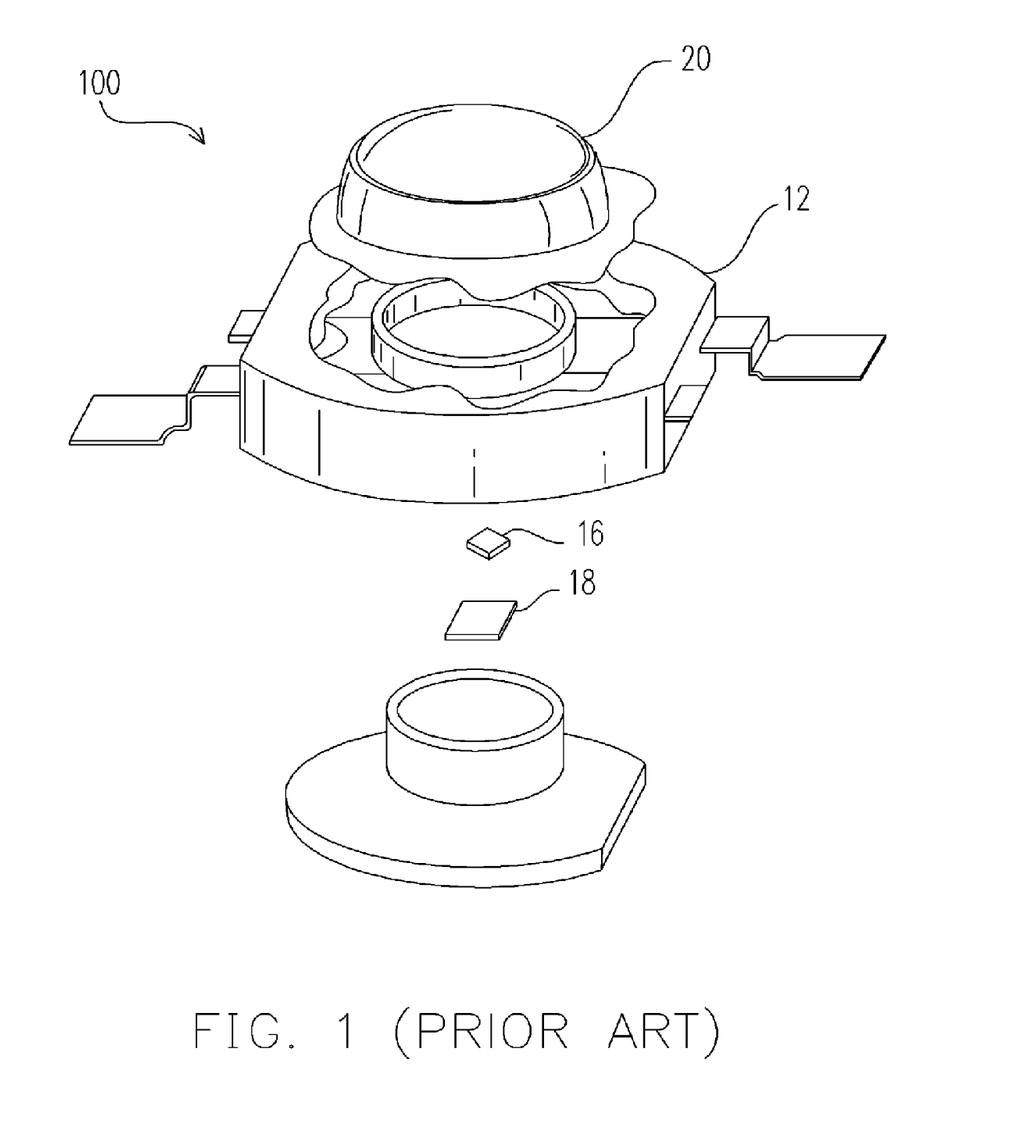
FIG. 1 is a schematic view of a conventional light emitting module capable of enhancing the SSL light emitting efficiency.

In U.S. Pat. No. 6,274,924 titled Surface mountable LED package and provided by the LumiLeds Corporation, a light emitting module capable of enhancing the SSL light emitting efficiency is disclosed. Referring to FIG. 1, the light emitting module 100 includes an embedded structure of a lamp shade 20 and a heat-absorbing socket 12, with a light emitting diode (LED) chip 16 being accommodated therein. The LED chip 16 is put into a module with a high reflective metal through flip chip, and the module also has a sub-mount 18 with high thermal conductivity. The packaged SSL module is relatively rigid and not bendable.

Figure 2:
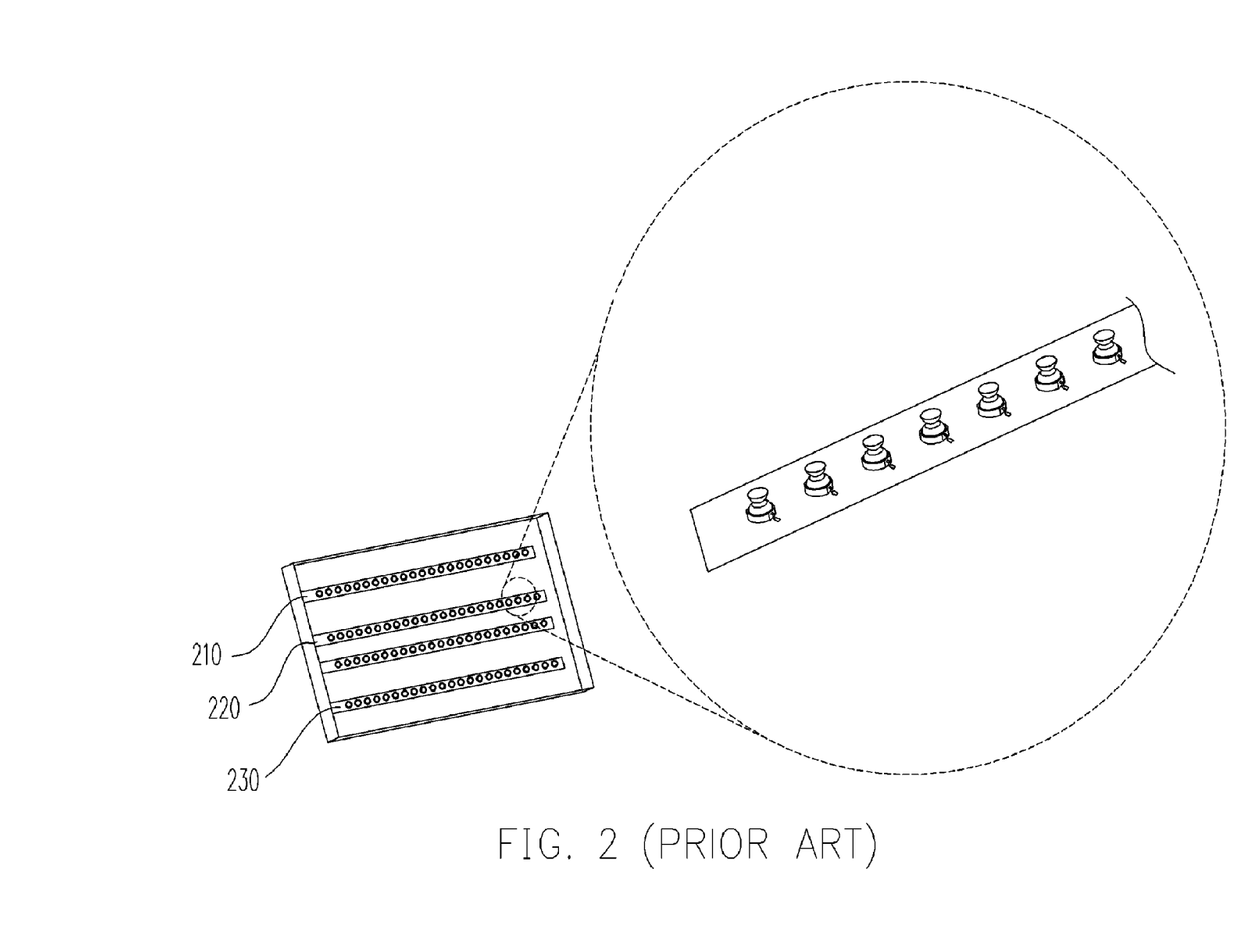
FIG. 2 is a schematic view of a conventional SSL back light module.

Moreover, referring to FIG. 2, Luxeon SSL back light module is manufactured by the current SSL back light module processing method of international manufactures, for example, Direct Type, and it can replace the current cold cathode fluorescent lamp (CCFL) back light module, without any light guides. SSL modules, e.g., 210, 220 and 230 shown in the figure, are arranged on a strip-shaped substrate in an order of green, red, blue, green ... (GRBG ....), with the interval between each SSL module as 12 mm. The Luxeon SSL back light module provides a preferred amount of emitted light, however, since it includes SSL dies of more than 40 mils in size, the heat dissipation is poor, and the module is also not bendable. When the SSL is applied in a back light module, the SSL lamps are jointed with a large-sized substrate, such that the heat dissipation is poor, and failure of the SSL elements is accelerated.

Figure 3A:
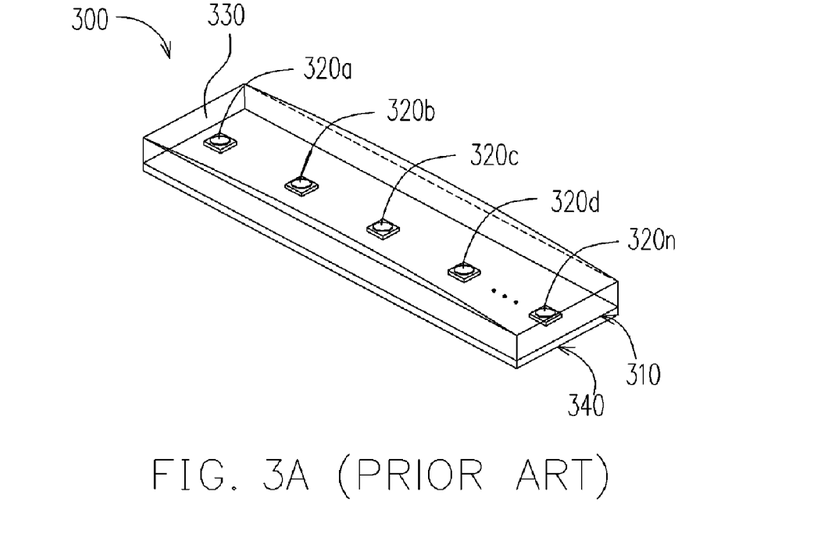
FIGS. 3A and 3B are schematic views of a conventional light source applied to the car lamp.
Figure 3B:
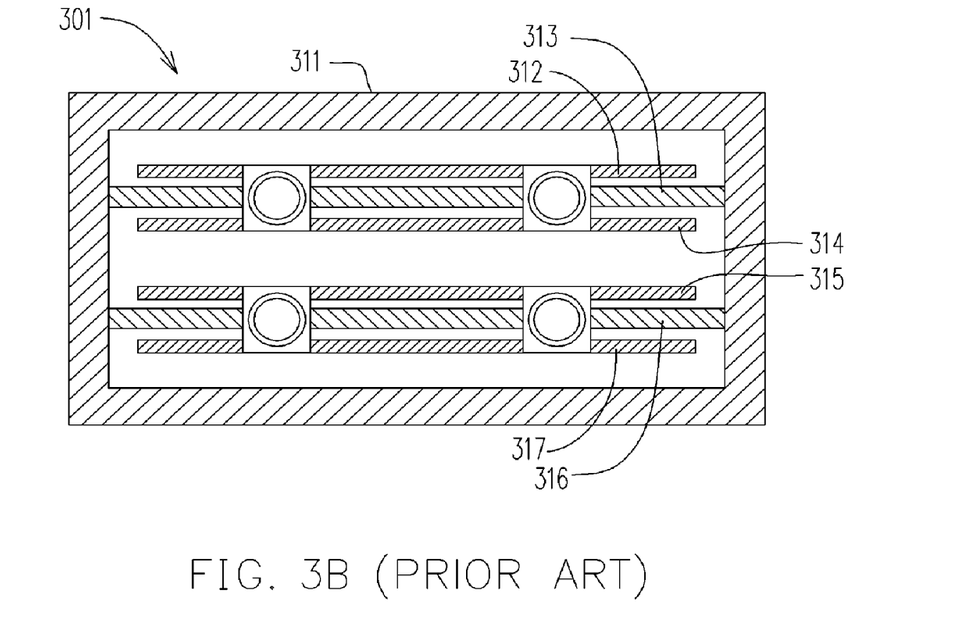

In addition, in U.S. Pat. No. 6,860,620 titled Light Unit Having Light Emitting Diodes, a light source applicable for car lamp is disclosed. Referring to FIG. 3A, a light source module 300 includes LEDs 320a-320n arranged as a line on a flexible and bendable substrate 310 and covered by an optical lens 330, and further includes a thermal conductive strip-shaped metal plate 340 disposed under the substrate 310, with a thermal conductive tape applied there-between for fixing them together. The assembled structure is shown in FIG. 3B, wherein a metal frame 311 is provided on the substrate 310 and has electric tracks 312, 314, 315 and 317 disposed therein, in which the electric tracks 312 and 315 are used to connect to the anode, and the electric tracks 314 and 317 are used to connect to the cathode. Besides, heat sink tracks 313 and 316 are also included. The light source module provides a bendable light source and also has a heat sink effect. However, the heat sink effect of the light source module 300 is restricted to the heat sink effect achieved at the segmented heat sink tracks on the same side, and a metal frame is also required, which makes a limited contribution to improving the heat sink effect, except for achieving an aesthetic appearance.

SUMMARY OF THE INVENTION

The present invention provides a bendable solid state lighting (SSL), wherein an SSL wafer is cut into small dies, and the dies are directly bonded with a bendable metal sub-mount that has a circuit, such that the SSL array has a desirable heat sink effect, preferred photoelectric characteristics, and relatively high light-emitting efficiency.

In an embodiment of the present invention, a bendable LED planar light source structure is provided, which comprises a flexible substrate with metal layers on both sides, wherein the metal layer on one side has a circuit layout, and the metal layer on the other side has a pattern structure or as a whole metal coating with reflecting and scattering characteristics, which effectively improves the light uniformity, light emitting intensity and efficiency of the planar light source. Meanwhile, bonding pads are provided on the same side or opposite side as the metal layer with the circuit layout, and an array of a plurality of LED dies is bonded with the bonding pads through wire bonding or flip chip bonding, such that the LED dies are conducted with current through the circuit layout on the flexible substrate, so as to form a planar light source.

In an embodiment of the present invention, a bendable light source is provided, which includes a flexible substrate and a plurality of light emitting diode (LED) dies. The flexible substrate has a first metal layer and a second metal layer, wherein the first metal layer has a circuit layout, and the second metal layer, formed on the flexible substrate, has a pattern structure or as a whole metal coating with reflecting and scattering characteristics, which efficiently improves the light uniformity and the light-emitting intensity and efficiency of the planar light source. In addition to the plurality of structure regions, the above mentioned structure region also has a plurality of bonding pads electrically connected to the first metal layer. The LED dies are disposed on the structure region in an array, and are bonded with the corresponding bonding pads, such that the LED dies are conducted with current via the circuit layout of the first metal layer on the flexible substrate, so as to form a planar light source.

In an embodiment of the present invention, a method for manufacturing a bendable solid state lighting (SSL) is provided. First, a first and a second metal layer having a predetermined circuit layout pattern and a structure region pattern are respectively deposited on both sides of a flexible substrate. A plurality of bonding pads is formed on the structure regions of the structure region pattern, and is used for being electrically connected to the first metal layer. A plurality of LED dies is disposed on the structure regions in an array, and bonded with the corresponding bonding pads, such that the LED dies are conducted with current via the circuit layout of the first metal layer on the flexible substrate, so as to form a planar light source.

The above LED dies and the bonding pads are bonded together through wire bonding, die bonding, eutectic die bonding or flip chip bonding, etc.

The above first metal layer and the second metal layer are multilayer metal structures formed through a multilayer metal deposition technique. In an embodiment, the multilayer metal deposition technique is chemical coating, physical coating, or a combination thereof.

The second metal layer provided on the flexible substrate is a metal coating with a high reflectivity, so as to enhance the forward light-emitting efficiency of the LED die, and also reduce the ratio between the light intensity at axial area of the LED die and that at surrounding area of the LED die, thus improving the light uniformity of the planar light source.

The size of the LED die is less than or equal to 25 mils, preferably between 8 and 14 mils. The LED dies are formed by cutting an epitaxial wafer or a thinned wafer.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIGS. 4A and 4B are schematic views of a bendable SSL structure in a preferred embodiment of the present invention.

DESCRIPTION OF EMBODIMENTS

The present invention provides a bendable solid state lighting (SSL), wherein the SSL wafer is cut into small dies, and the dies are directly bonded with a bendable metal sub-mount having a circuit, such that the SSL array has desirable thermal conductivity, preferred photoelectric characteristics, and relatively high light-emitting efficiency.

Conventionally, the high power SSLs are generally manufactured into those with a large size, i.e., larger than 40 mils, thus resulting in a problem of poor current distribution, and poor light-emitting efficiency due to the heat accumulation. In order to solve the above problem, the present invention provides a bendable solid state light source, in which the thinned wafer is cut into small dies, i.e., less than 40 mils, and a size of less than or equal to 25 mils also can be used in an embodiment, or preferably between 8 mils and 14 mils in a preferred embodiment. The thinned small dies are directly bonded with the bendable metal sub-mount having a circuit through the micro packaging technique, or alternatively, the circuit connection between dies is achieved through the wafer packaging technique before the individual thinned small dies are formed, so as to enhance the light-emitting efficiency of SSL and improve the thermal conductivity, thus forming a bendable planar light source.

The present invention provides specific techniques of a manufacturing process of a bendable solid state lighting (SSL), which includes the following steps. First, structure regions and conductive lines are graved on metal films, and multiple metal layers are deposited on the flexible substrate through the multilayer metal deposition technique, such that the metal layer of the structure regions and conductive lines is thickened, thus enhancing the strength of the structure regions and conductive lines on the metal film when being bent. The increased thickness required of this part is determined optionally according to the actual demands. The flexible sub-mount bonded with the bendable LED planar light source in a preferred embodiment of the present invention is characterized in that, the surface of the sub-mount is first processed by the multilayer metal deposition technique (chemical coating, physical coating, or a combination thereof), such that the structure of the metal line on the flexible sub-mount is strengthened, the bendability is enhanced, and the thermal conductivity is improved.

After the structure regions and conductive lines have been formed, small SSL dies, with a size of less than 40 mils, less than 25 mils in an embodiment, and preferably between 8 mils and 14 mils in a preferred embodiment, are bonded with a bendable metal film through a bonding technique, so as to be fixed on the flexible substrate. For example, the bonding technique includes wire bonding, Ag die bonding, eutectic die bonding, or flip chip bonding etc.

Generally, the adhesive used for bonding dies contains resin system and underfills, in which the resin system includes resin, curing agent, flexibilizer, diluent and accelerator; and the underfills generally include metal underfills, ceramic underfills and polymer underfills. Generally, the adhesive is classified into conductive adhesive and non-conductive adhesive. The conductive adhesive generally contains conductive underfills such as Ag particles as conductive medium, and the non-conductive adhesive contains non-conductive underfills, for example, ceramic underfills such as silica or boron nitride ceramic particles, or polymer underfills such as polymer particles.

After the bonding process has been finished, a soft gel is put on the dies, so as to protect the structure of the SSL, and thereby forming a bendable light source. In an embodiment, the bendable light source may be jointed with diffusion films and prism films, so as to form a bendable back light module.

In the above wafer-level packaging, the flexible sub-mount is directly connected with bumps or solder balls, such that no interposers, underfills or lead frames are required, and processes such as die bonding and wire bonding are omitted, and thereby material and labor costs are significantly reduced, thus satisfying the chip packaging demands of low cost and refined design. Almost all the manufacturing processes of the wafer-level packaging are completed on the wafer, thus the time period of the packaging process is effectively reduced.

Figure 4A:
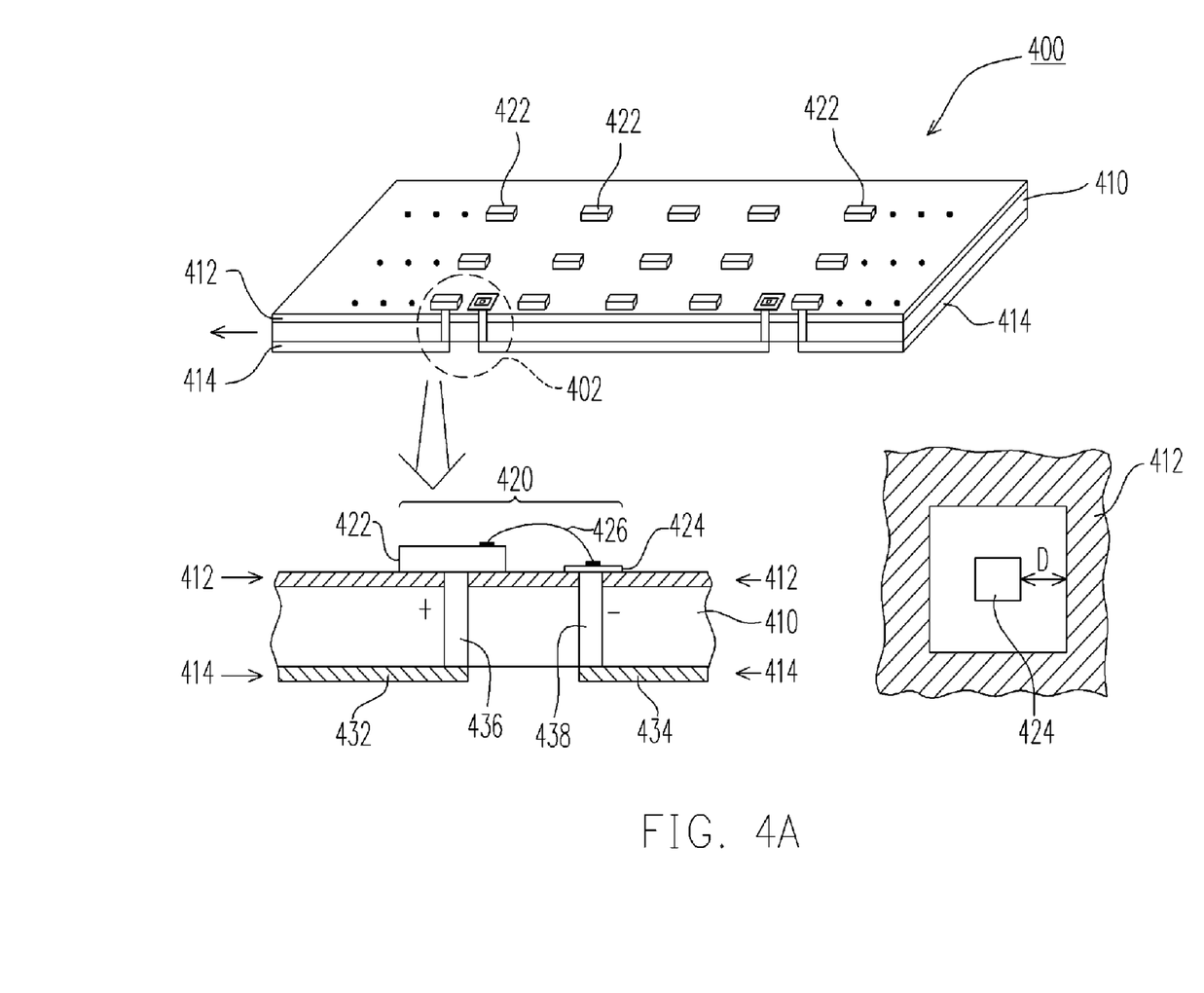

FIG. 4A shows a structural view of a bendable solid state lighting (SSL) in a preferred embodiment of the present invention. On a bendable flexible substrate 410, for example, a plastic substrate, multiple metal layers are entirely deposited on both sides of the flexible substrate through a multi-layer metal deposition technique, such as a first metal layers 414 and a second metal layer 412 (shown in the figure) made of, e.g., Cu. The first metal layer 414 is provided with a circuit layout, so as to achieve the required line connection. The first metal layer 414 as shown in the figure has a power line 432 for connecting to the anode (+) or a power line 434 for connecting to the cathode (−).

A plurality of structure regions 420 is pre-graved on the second metal layer 412 for arranging an LED die array. In the structure of this embodiment of the present invention, a plurality of bonding pads is formed in the structure regions 420 on the flexible substrate 410, and the array of a plurality of LED dies is bonded with the bonding pads on the flexible substrate 410 through wire bonding or flip chip bonding. The LED die 422 as shown in the figure is connected to the anode power line 432 on the first metal layer 414 through an electrical via 436, and connected to the cathode power line 434 on the first metal layer 414 through the electric via 438 via the wiring connection point 424 by way of wiring bonding. The distance between the wiring connection point 424 and the second metal layer 412 is set to be between 5 μm and 200 μm, depending on the design requirements. With the architecture, the LED dies are conducted with current through the circuit layout on the flexible substrate 410, so as to form a planar light source. With the packaging technique, the materials, such as sub-mount and lead frame, required when packaging the conventional LED module may be reduced. Since the LED dies 422 are small-sized dies, they are protected by a soft gel with desired light transmittance after being jointed with the second metal layer 412 of the bendable metal film.

As for the bendable solid state lighting (SSL) provided in the present invention, the LED dies 422 are directly bonded with the second metal layer 412 on the flexible substrate 410, thus, the second metal layer 412 with a pattern structure or a whole metal coating with reflecting and scattering characteristics, used for arranging the array of LED dies 422, is formed or entirely formed on the flexible substrate 410, which effectively improves the thermal conductivity of the LED dies, and also effectively improves the light uniformity and light-emitting intensity and efficiency of the planar light source. The so-called "entirely" herein is defined as substantially involving most regions on the flexible substrate 410 except the predetermined structure regions 420 or wiring regions on the second metal layer 412. For example, except the regions required by the array of the LED dies 422, if the area of the second metal layer 412 on the flexible substrate 410 reaches, for example, 70%-90% of the area of the flexible substrate 410, it satisfies the definition of "entirely", and of course, it is not limited to this range, as long as the second metal layer 412 is large enough to achieve the predetermined thermal conductivity and reflecting and scattering characteristics. In an alternative embodiment, the second metal layer 412 is a metal coating with a pattern structure having reflecting and scattering characteristics, and except the predetermined structure regions 420 or the wiring regions on the second metal layer 412, only a pattern structure is required for achieving the reflecting and scattering characteristics required on design, so as to meet the requirements, however, most regions on the flexible substrate 410 must be involved.

In addition, the material of the second metal layer 412 must be selected to be a metal coating with high reflectivity and scattering rate, thus enhancing the thermal conductivity, and meanwhile, the lateral light generated by the LED die 422 is irradiated to the metal with high reflectivity, and then reflected and scattered towards upward, so as to enhance the forward light-emitting efficiency of the LED planar light source, and thereby reducing the ratio between the light intensity at the axial area of the LED die 422 and that at the surrounding area of the LED die, thus improving the light uniformity for the planar light source. The metal materials with reflecting and scattering characteristics are all applicable to the second metal layer 412.

Furthermore, the array of LED dies 422 is characterized in that, the light source of the LED die is a red® AlGaInP epitaxial layer, a green (G) InGaN/AlGaN epitaxial layer, a blue/ultraviolet(B/UV) InGaN/AlGaN epitaxial layer, which may exist individually or in combination, or it is any combination of the four colors and various fluorescent materials. In addition, the size of the LED die 422 must be less than 40 mils, less than 25 mils in an embodiment, and preferably between 8 mils and 14 mils in a preferred embodiment. The arrangement of the array of the LED dies 422 involves spacing by a certain distance, thus enhancing the bendable characteristic of the bendable solid state lighting (SSL).

Figure 4B:
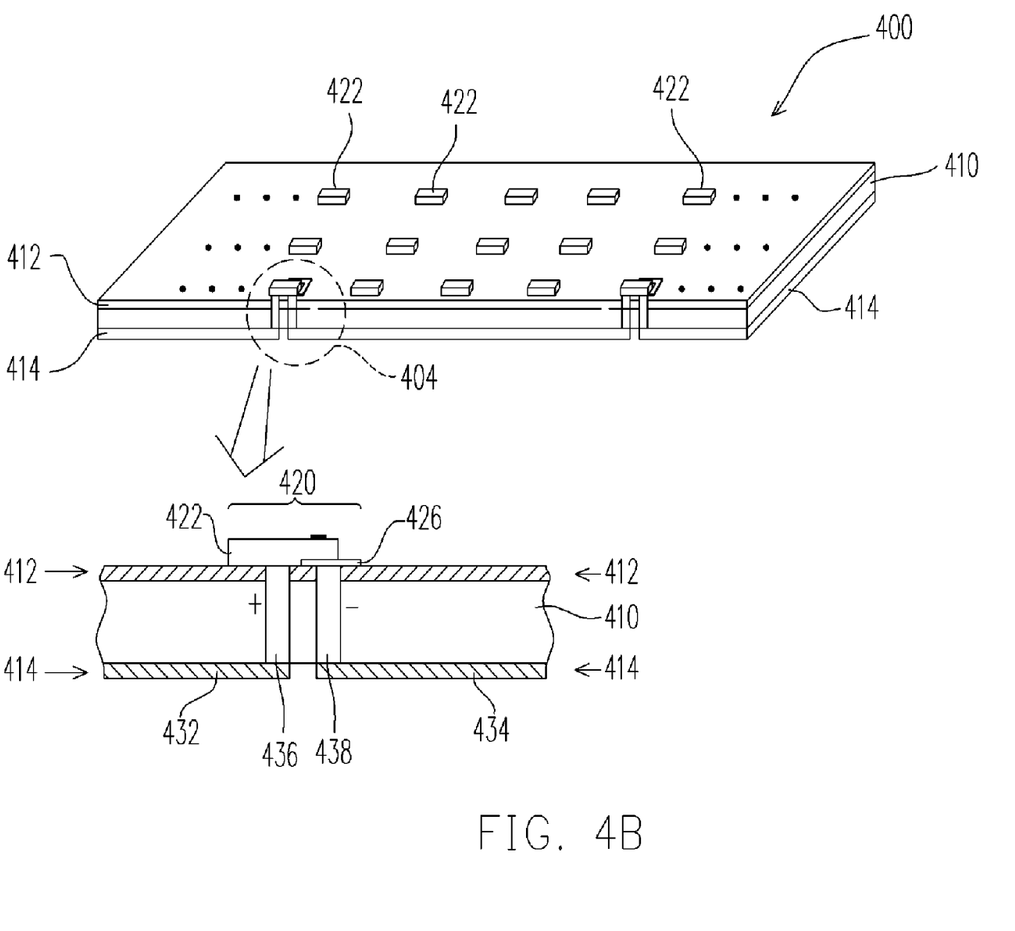
FIG. 4B is a schematic equivalent circuit diagram of a planar-coating resistor structure of FIG. 4A.

The structure of the bendable solid state lighting (SSL) in another embodiment of the present invention is shown in FIG. 4B, which is substantially the same as that of FIG. 4A, thus the same elements are not described herein any more. The difference lies in that, the structure region 420 used for arranging the LED die array is provided on the second metal layer 412. A plurality of bonding pads is formed on the flexible substrate 410 for directly connecting the LED dies 422 to the anode power line 432 or cathode power line 434 on the first metal layer 414, and in the same region, an additional wire bonding for connecting to the wiring connection points 424 as shown in FIG. 4A is not required, but instead, the connection point 426 is connected to the cathode power line 434 on the first metal layer 414 through the electrical via 438.

The size of the LED die must be selected to be less than 40 mils, less than 25 mils in an embodiment, and between 8 mils and 14 mils in a preferred embodiment, which is one of the characteristics of the bendable SSL of the present invention, in view of the bendable characteristic of the bendable SSL, and photoelectric characteristics and light-emitting efficiency of the LED die.

The SSL is epitaxially grown on the III-V group substrate (GaAs, GaP, InP or Sapphire), which is essentially rigid and friable, and not bendable. The inventive method provided by the present invention is cutting the SSL epitaxial wafer or thinned wafer into small dies (preferably between 8 mils and 14 mils, $\leqq$40 mils), and the dies are bonded with the bendable metal sub-mount, thus improving the heat dissipation, enhancing light emitting efficiency, and providing the features of being thin and bendable.

Figure 5:
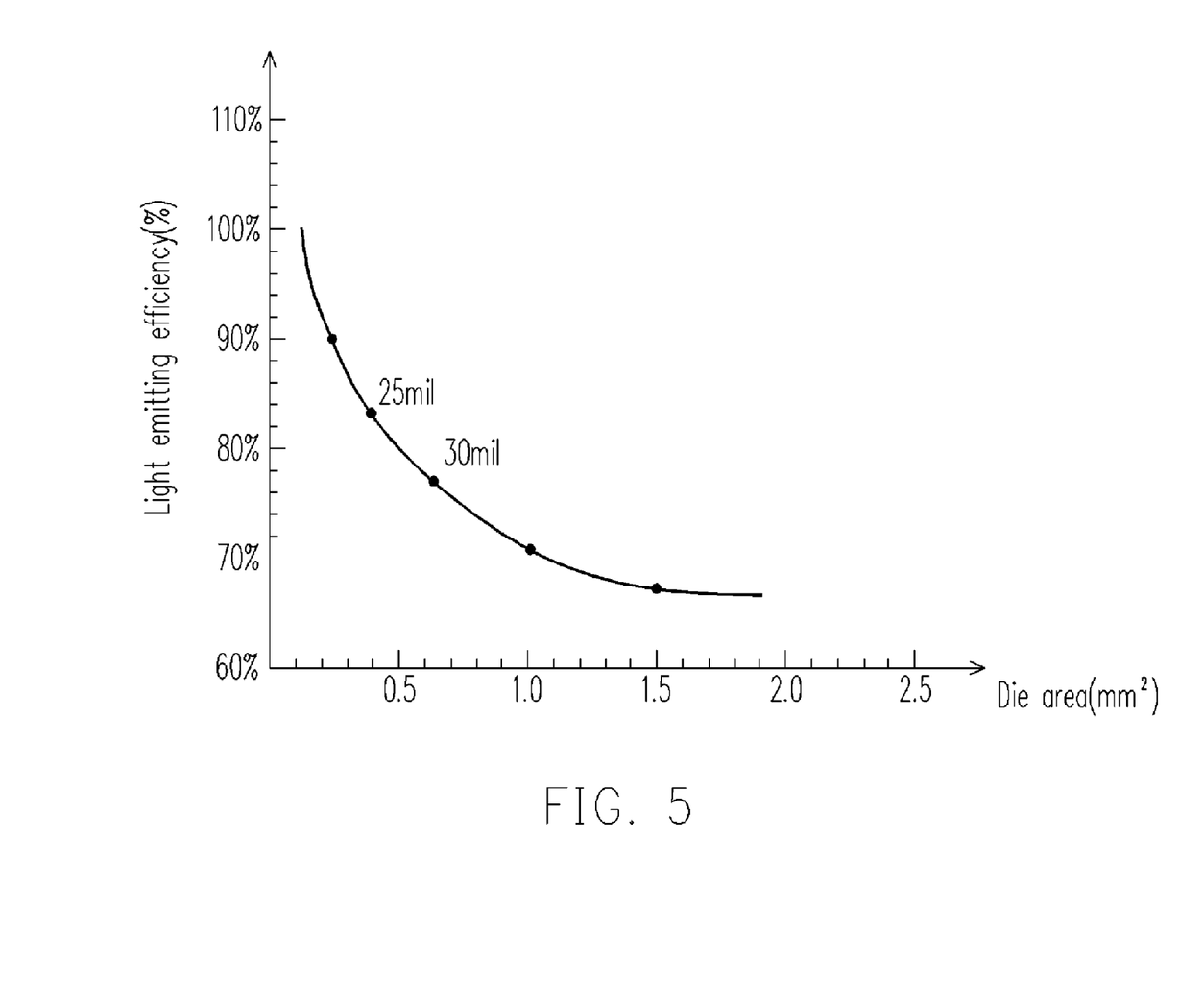
FIG. 5 is a schematic view of the relationship between the light emitting efficiency of the LED die and the area of the die.

The light emitting characteristics of the small-sized LED die is shown in FIG. 5. Under the circumstance that the LED die is less than or equal to 40 mils, its light emitting efficiency is more than 75%, and if a smaller size is provided, the light emitting efficiency becomes higher. Through experiments, it has been found that, if the size is less than 25 mils in an embodiment, the light emitting efficiency is more than 82%, and the small-sized LED die used in the present invention is between 8 mils and 14 mils in a preferred embodiment. Also, the small-sized LED die almost provides no contact forces when being bent, thus it is not easily broken, which is because $\delta$ is in direct proportion to F/t, where t is the thickness, $\delta$ is the bend deformation, and F is the external force.

Figure 6:
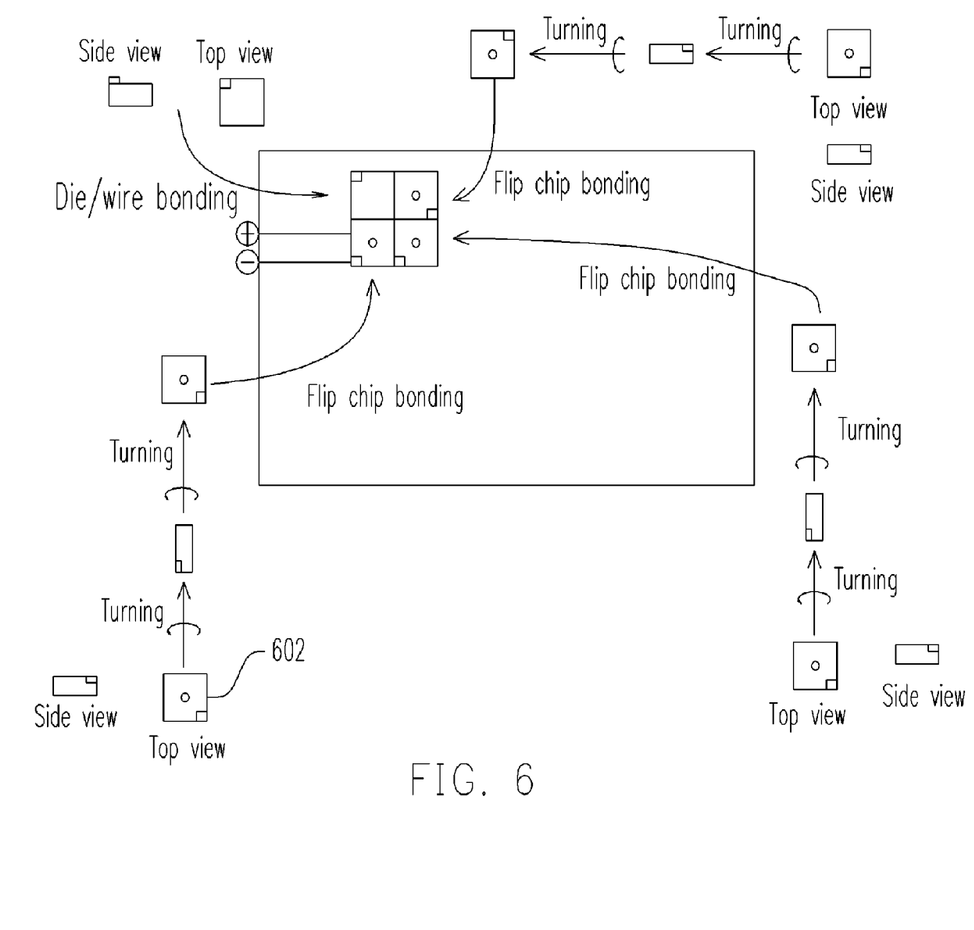
FIG. 6 is a schematic view of packing the LED dies of the SSL according to the present invention.

In the bendable SSL of the present invention, the method for packaging the LED dies, as shown in FIG. 6, includes die/wire bonding and flip chip bonding, and the LED dies 602 are directly packaged on the flexible substrate 410 having a plurality of bonding pads.

To sum up, the bendable LED planar light source structure provided in the present invention is characterized in comprising a flexible substrate with metals (Cu) on both sides. One side of the metal flexible substrate has a circuit layout, and meanwhile, bonding pads are provided on the same side or opposite side. An array of a plurality of LED dies is bonded with the bonding pads on the flexible substrate through wire bonding or flip chip bonding, such that the LED dies are conducted with current through the circuit layout on the flexible substrate, so as to form a planar light source, thus reducing the materials (sub-mount, lead frame, etc.) required when packaging the existing LED module.

Furthermore, the flexible sub-mount bonded with the bendable LED planar light source provided in the present invention is characterized in that, the surface of the sub-mount must be processed by a multilayer metal deposition technique, such as chemical coating, physical coating, or any combination thereof, thus strengthening the metal lead line structure on the flexible sub-mount, increasing the bendability, and enhancing the thermal conductivity.

Another configuration of the bendable LED planar light source structure provided in the present invention is characterized in that, the contact surface of the LED dies and the flexible sub-mount is a metal coating with a high reflectivity and having a circuit layout provided on the back side, thus improving the thermal conductivity of the LED dies. Meanwhile, the lateral light generated by the LED dies are irradiated to metals with high reflectivity, and then reflected towards upward, so as to increase the forward light-emitting efficiency for the LED planar light source, and thereby reducing the ratio between the light intensity at axial area of the LED dies and that at the surrounding area of the LED dies, thus improving the light uniformity of the planar light source.

The small-sized dies are formed by cutting the epitaxial wafer or thinned wafer. After the small-sized dies are jointed with the bendable metal film, a soft gel with desirable light transmittance is required for protecting the dies.

The bendable SSL provided in the present invention uses small-sized dies, unlike the large SSL, for example, more than 40 mils, thus avoiding the problems of poor current distribution of dies, and poor light-emitting efficiency due to heat accumulation. Also, small-sized dies are advantageous for improving the bendability, thus the bendable SSL provided in the present invention achieves preferred thermal conductivity, preferred photoelectric characteristics, and relatively high light-emitting efficiency.

Figure 7:
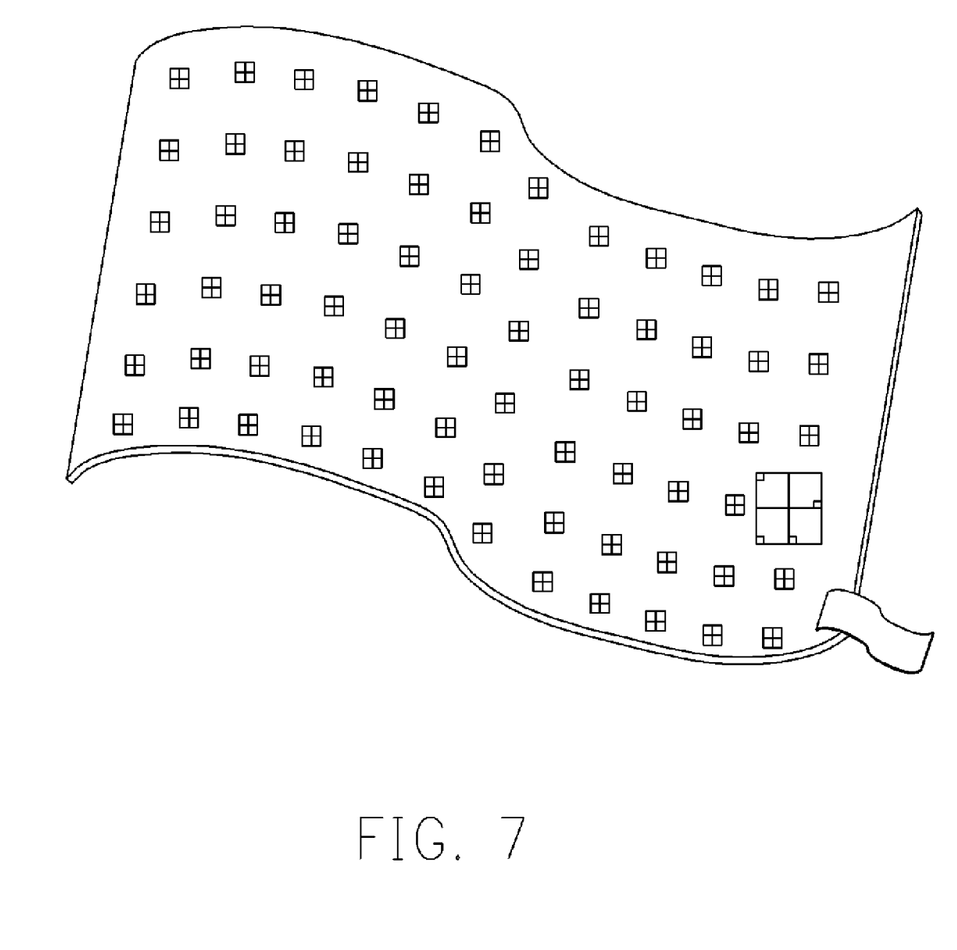
FIG. 7 is a schematic view of the bendable SSL of the present invention being applied to products.
Figure 8:
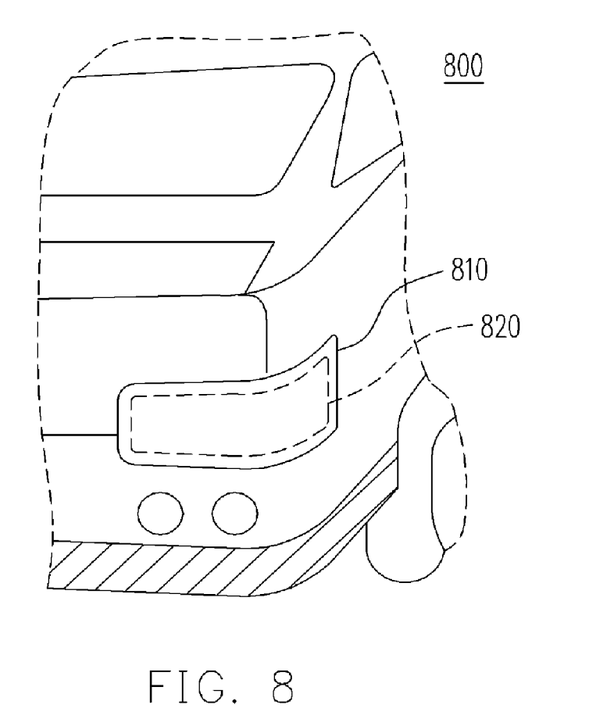
FIG. 8 is a schematic view of the bendable SSL of the present invention being applied to the car lamp.

As shown in FIG. 7, the bendable SSL disposed on the flexible substrate according to the present invention is suitable for various vehicles, for example, a car lamp in any configurations with any color. As shown in FIG. 8, the car lamp on a car 800 may employ a lamp shade 810 with any configuration, and have the bendable LED planar light source 820 of the present invention being disposed therein, which is highly practical. In the bendable LED planar light source 820 of the present invention, the SSL wafer is cut into small-sized dies, and then, the dies are directly bonded with the bendable metal sub-mount having a circuit, such that the SSL array achieves a preferred thermal conductivity, preferred photoelectric characteristics, and relatively high light-emitting efficiency. Additionally, since small-sized dies are used, the design on the mold provides a bendablility that cannot be achieved by the large dies. Therefore, the car lamp on the car 800 is more flexible.

Figure 9:
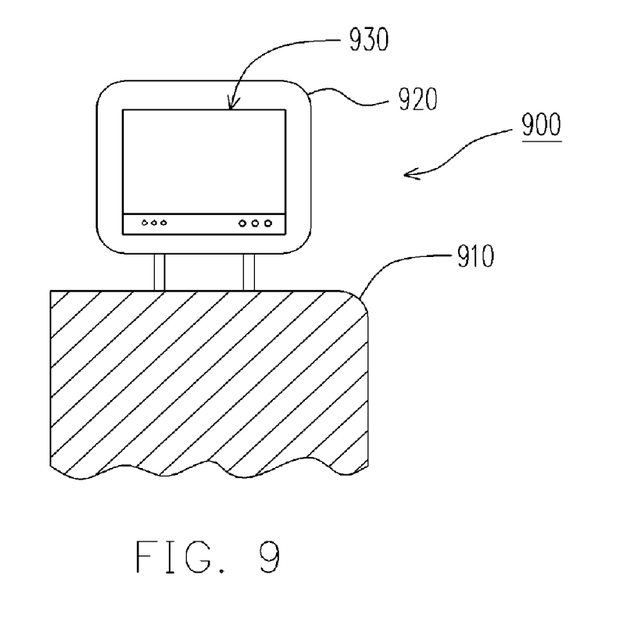
FIG. 9 is a schematic view of the bendable SSL of the present invention being applied to displaying device on vehicles.

Moreover, the display light source on mobile communication equipments, for example, the back light source on color mobile phones, and the display light source used in vehicles may also employ the bendable LED planar light source of the present invention to provide a desired light source. As for the display light source used in vehicles, for example, the chair 900 in the car as shown in FIG. 9 has a base 910 and a head support 920 connected thereon, and a display 930 is disposed on the head support 920.

Figure 10A:
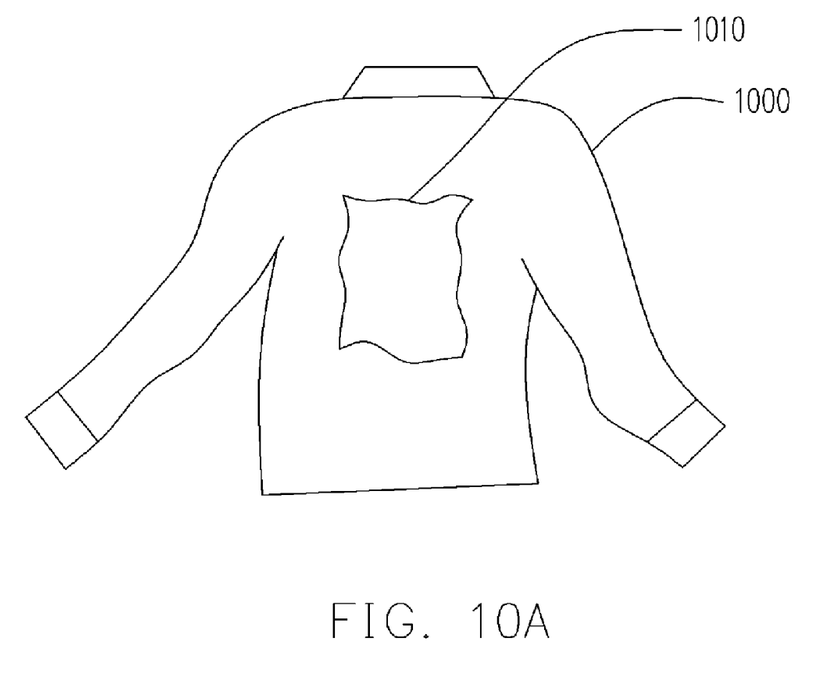
FIGS. 10A and 10B are schematic views of the bendable SSL of the present invention being applied to clothes.
Figure 10B:
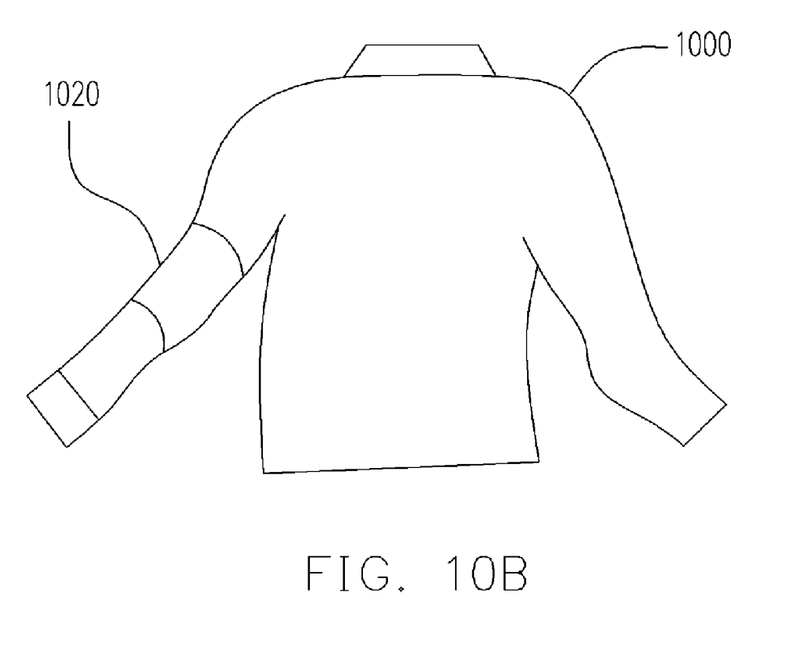

The bendable SSL module of the present invention is highly bendable, thus it may be applied to, for example, clothes for advertisement or alarm. As shown in FIG. 10A, the bendable SSL module 1010 of the present invention is applied on the back of the clothes 1000, for advertising or alarming. As shown in FIG. 10B, the bendable SSL module 1020 of the present invention is applied on the arm part of the clothes 1000, also for advertising or alarming. Besides bendability, heat dissipation is also one of the most important issues when applying the bendable SSL module. In a practical verification example, the bendable SSL module of the present invention is successfully applied to a 7-inch bendable LED back light source. The monochrome (red and white) LED dies are used to manufacture the bendable back light plate through wire bonding or die bonding, and after a 7-inch red light source and white light source are lightened, with the power consumption of 3 W, the intensity exceeds 12000 nits, and the surface temperature is less than 50° C., without any additional heat sinks. Also, the overall thickness is less than 1.0 mm, and the bendable diameter is less than 1 cm.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bendable light source, comprising:
   a flexible substrate, having a first metal layer and a second metal layer, wherein the first metal layer has a circuit layout, and the second metal layer is formed on the flexible substrate and has a pattern structure, and besides a plurality of structure regions, a plurality of bonding pads is provided on the structure regions, and electrically connected to the first metal layer; and
   a plurality of light emitting diode (LED) dies, arranged on the structure regions in an array, and bonded with the corresponding bonding pads, such that the LED dies are conducted with current through the circuit layout of the first metal layer on the flexible substrate, so as to form a planar light source, wherein the second metal layer is a metal coating with high reflectivity and scattering rate and exposes to a lateral light generated by the LED dies, and the structure regions are enclosed by the pattern structure of the second metal layer.

2. The bendable light source as claimed in claim 1, wherein the LED dies are bonded with the corresponding bonding pads through wire bonding, die bonding, eutectic die bonding, or flip chip bonding.

3. The bendable light source as claimed in claim 1, wherein the first metal layer and the second metal layer provided on the flexible substrate are multilayer metal structures formed through a multilayer metal deposition technique.

4. The bendable light source as claimed in claim 3, wherein the multilayer metal deposition technique is chemical coating, physical coating, or a combination thereof.

5. The bendable light source as claimed in claim 1, wherein the size of the LED dies is less than or equal to 40 mils.

6. The bendable light source as claimed in claim 5, wherein the LED dies are formed by cuffing an epitaxial wafer or thinned wafer.

7. The bendable light source as claimed in claim 5, further comprising a light-transmissive soft gel covered on the LED dies.

8. The bendable light source as claimed in claim 1, wherein the size of the LED dies is between 8 mils and 14 mils.

9. The bendable light source as claimed in claim 8, wherein the LED dies are formed by cuffing an epitaxial wafer or a thinned wafer.

10. The bendable light source as claimed in claim 8, further comprising a light-transmissive gel covered on the LED dies.

11. The bendable light source as claimed in claim 1, wherein the pattern structure of the second metal layer occupies an area of the surface of the flexible substrate upon where the LED dies are disposed, wherein the area is large enough to achieve the predetermined thermal conductivity for the LED dies and to achieve the predetermined reflecting and scattering characteristics for the lights generated by the LED dies, and also reduce the ratio between the light intensity at the axial area of the LED die and that at the surrounding area of the LED die, thus improving the light uniformity of the planar light source and providing a reflecting and scattering effect.

12. The bendable light source as claimed in claim 1, wherein the second metal layer occupies about 70% to 90% of the total area of the surface of the flexible substrate upon where the LED dies are disposed.

* * * * *